United States Patent
Elsey et al.

(10) Patent No.: US 11,604,410 B2
(45) Date of Patent: Mar. 14, 2023

(54) APPARATUS AND METHOD FOR MAKING A STEREOLITHOGRAPHIC OBJECT

(71) Applicant: Zydex Pty Ltd, Alexandria (AU)

(72) Inventors: Justin Elsey, Alexandria (AU); Rafael Bayguzin, Alexandria (AU)

(*) Notice: Subject to any disclaimer, the term of this patent is extended or adjusted under 35 U.S.C. 154(b) by 158 days.

(21) Appl. No.: 16/495,403

(22) PCT Filed: Mar. 20, 2018

(86) PCT No.: PCT/AU2018/050256
§ 371 (c)(1),
(2) Date: Sep. 19, 2019

(87) PCT Pub. No.: WO2018/170545
PCT Pub. Date: Sep. 27, 2018

(65) Prior Publication Data
US 2021/0294210 A1    Sep. 23, 2021

(30) Foreign Application Priority Data
Mar. 21, 2017 (AU) .............................. 2017900989

(51) Int. Cl.
| | |
|---|---|
| *G03F 7/00* | (2006.01) |
| *B29C 64/245* | (2017.01) |
| *B29C 64/393* | (2017.01) |
| *B29C 64/135* | (2017.01) |
| *G01L 5/00* | (2006.01) |
| *B33Y 10/00* | (2015.01) |

(52) U.S. Cl.
CPC .......... *G03F 7/0037* (2013.01); *B29C 64/135* (2017.08); *B29C 64/245* (2017.08); *B29C 64/393* (2017.08); *G01L 5/0076* (2013.01); *B33Y 10/00* (2014.12)

(58) Field of Classification Search
CPC ... G03F 7/0037; B29C 64/135; B29C 64/245; B29C 64/393; B29C 64/124; G01L 5/0076; B33Y 10/00; B33Y 30/00; B33Y 50/02
See application file for complete search history.

(56) References Cited

U.S. PATENT DOCUMENTS

| | | | |
|---|---|---|---|
| 9,452,567 B2 * | 9/2016 | Syao | B29C 64/124 |
| 2011/0008961 A1 | 4/2011 | El-Siblani et al. | |
| 2011/0089610 A1 * | 4/2011 | El-Siblani | B29C 64/188 425/89 |
| 2013/0075954 A1 | 3/2013 | Gregory, II | |

(Continued)

FOREIGN PATENT DOCUMENTS

WO    WO 2009/003696 A2    1/2009

OTHER PUBLICATIONS

Extended Europan Search Report in related European Patent Application No. 18771251.8.

(Continued)

*Primary Examiner* — Nahida Sultana
(74) *Attorney, Agent, or Firm* — Eric L. Lane; Green Patent Law

(57) ABSTRACT

An object can be made one section at a time, that is layerwise, using an apparatus for making an object using a stereolithographic method. Disclosure generally relates to an apparatus for making a stereolithographic object and a method for making a stereolithographic object. An apparatus (100) for making an object (122) is disclosed.

15 Claims, 13 Drawing Sheets

(56) References Cited

U.S. PATENT DOCUMENTS

| | | | |
|---|---|---|---|
| 2015/0027239 A1* | 1/2015 | Konkle | B29C 64/106 |
| | | | 242/563 |
| 2015/0123319 A1* | 5/2015 | Fortunato | B29C 64/124 |
| | | | 264/401 |
| 2017/0028646 A1* | 2/2017 | Sun | B33Y 99/00 |
| 2017/0368747 A1 | 12/2017 | Nolet et al. | |
| 2018/0297285 A1* | 10/2018 | Sheppard | B29C 64/245 |
| 2019/0351614 A1* | 11/2019 | Nolet | B29C 64/393 |
| 2019/0369566 A1* | 12/2019 | Lobovsky | B33Y 10/00 |
| 2020/0147873 A1* | 5/2020 | Lewis | B29C 64/118 |
| 2020/0338830 A1* | 10/2020 | Deetz | B33Y 50/00 |

OTHER PUBLICATIONS

International Search Report dated Jun. 6, 2018 in related International Patent Application No. PCT/AU2018/050256.
Written Opinion in related international Patent Application No. PCT/AU2018/050256.

* cited by examiner

APPARATUS AND METHOD FOR MAKING A STEREOLITHOGRAPHIC OBJECT

FIELD OF THE INVENTION

The present invention generally relates to an apparatus for making a stereolithographic object and a method for making a stereolithographic object.

BACKGROUND OF THE INVENTION

An object can be made one section at a time, that is layerwise, using an apparatus for making an object using a stereolithographic method. In a step of the stereolithographic method, a layer of a material used for making the object may be solidified in the shape of a section of the object. The step may be repeated until each of a plurality of sections constituting the object are made.

In the context of this specification, a section is to be understood to encompass a slice of the stereolithographic object. A planar section encompasses a portion of the stereolithographic object located between two parallel planes that intersect the stereolithographic object. Generally, but not necessarily, the sections formed are planar sections.

It may be desirable to have improved apparatus for making an object.

SUMMARY OF INVENTION

Disclosed herein is an apparatus for making a stereolithographic object. The apparatus comprises an element having a surface for disposing thereon a material used to make a stereolithographic object. The apparatus comprises a platform for making the stereolithographic object thereon. The apparatus comprises a positioner operably coupled to at least one of the platform and the element and operable to change a distance between the platform and the element and so change the distance of a portion of the stereolithographic object when made and the surface to be the thickness of a stereolithographic layer of the stereolithographic object. The apparatus comprises a force sensing system configured to generate force information indicative of a force transferred between the element and the platform. The apparatus comprises a controller for processing the force sensing information.

In an embodiment, the force sensing system supports the element.

In an embodiment, the force sensing system has a flat surface on which the element is received, causing the element to adopt a flat configuration.

In an embodiment, the force sensing system comprises a pressure sensitive array of tactile sensors.

In an embodiment, the pressure sensitive array of tactile sensors is transparent to a material hardening light.

An embodiment comprises a radiation source configured to generate the material hardening light and direct the material hardening light to the surface through the pressure sensitive array of tactile sensors and the element for selectively hardening an area of the material when so disposed.

In an embodiment, the pressure sensitive array of tactile sensors comprises a touch-screen sensor.

In an embodiment, the controller is configured to generate force position information indicative of the position of the force on the element using the force information.

In an embodiment, the force is transferred between the element and the platform by debris disposed therebetween, and the position information is indicative of the position of the debris on the element.

In an embodiment, the controller is configured to generate a debris detection alert.

In an embodiment, the controller is configured to stop the positioner reducing the distance between the platform and the element when debris is detected.

In an embodiment, the processor is configured to use the force information to determine a quantity of material.

In an embodiment, the force sensing system comprises a plurality of force sensors that are spaced apart.

In an embodiment, the force sensing system comprises a plurality of force sensors that are spaced apart in at least one direction that is orthogonal to a normal to the surface.

In an embodiment, the force sensing system comprises a plurality of force sensors that are spaced apart in two directions that are each orthogonal to a normal to the surface.

In an embodiment, the force information is indicative of a portion of the force sensed by each of the plurality of force sensors.

In an embodiment, the control system is configured to use the force information to determine a position on the material receiving surface that the force is applied to.

Disclosed herein is an apparatus for making a stereolithographic object. The apparatus comprises a platform for making the stereolithographic object thereon and a vessel for disposing therein a material for making the stereolithographic object. The apparatus comprises a force sensing system supporting vessel and configured to generate force information indicative of the weight of the material when so disposed. The apparatus comprises and a processor that determines when the force information satisfies a material weight condition and if so generates a material weight condition signal.

In an embodiment, the material weight condition is that weight of the material indicated by the force information is one of equal to and less than a predefined material weight value.

Disclosed herein is a method for monitoring consumption of a material for making a stereolithographic object. The method comprises disposing a material for making a stereolithographic object in a vessel adjacent a platform for making a stereolithographic object thereon. The method comprises making the stereolithographic object on the platform and in doing so consuming the material disposed in the vessel. The method comprises generating force information indicative of the weight of the material in the vessel. The method comprises determining whether the force information satisfies a material weight condition and if so satisfied generate a material weight condition signal.

Disclosed herein is a method. The method comprises the step of disposing a material used to make a stereolithographic object on a surface of an element. The method comprises the step of moving a portion of the stereolithographic object toward a position adjacent the element for forming a stereolithographic layer. The method comprises the step of sensing a force applied on the element.

An embodiment comprises the step of tensioning the element. An embodiment comprises the step of tensioning the element in two orthogonal directions. An embodiment comprises tensioning the element with a member that is biased into the element. The element may be a flexible element.

In an embodiment, the surface is upwardly facing. Alternatively, the surface may be downwardly facing.

Disclosed herein is an apparatus. The apparatus comprises an element having a surface for disposing thereon a material used to make a stereolithographic object. The apparatus comprises a positioner for moving a portion of the stereolithographic object towards a position adjacent the element for forming a stereolithographic layer. The apparatus comprises at least one force sensor configured for sensing a force applied on the element.

In an embodiment, the controller is configured to use the sensed force to determine a quantity of material.

In an embodiment, the at least one force sensor is beneath the element.

Were possible, any one or more features of above disclosure may be combined with any one or more features of the above disclosure as is suitable.

Any liquid used to make a stereolithographic object referred to in this specification may, as appropriate, be replaced with any suitable material or fluid used to make a stereolithographic object, and vice versa.

BRIEF DESCRIPTION OF THE FIGURES

In order to achieve a better understanding of the nature of the present invention, embodiments will now be described, by way of example only, with reference to the accompanying figures in which.

DETAILED DESCRIPTION OF EMBODIMENTS OF THE INVENTION

Figure 1:
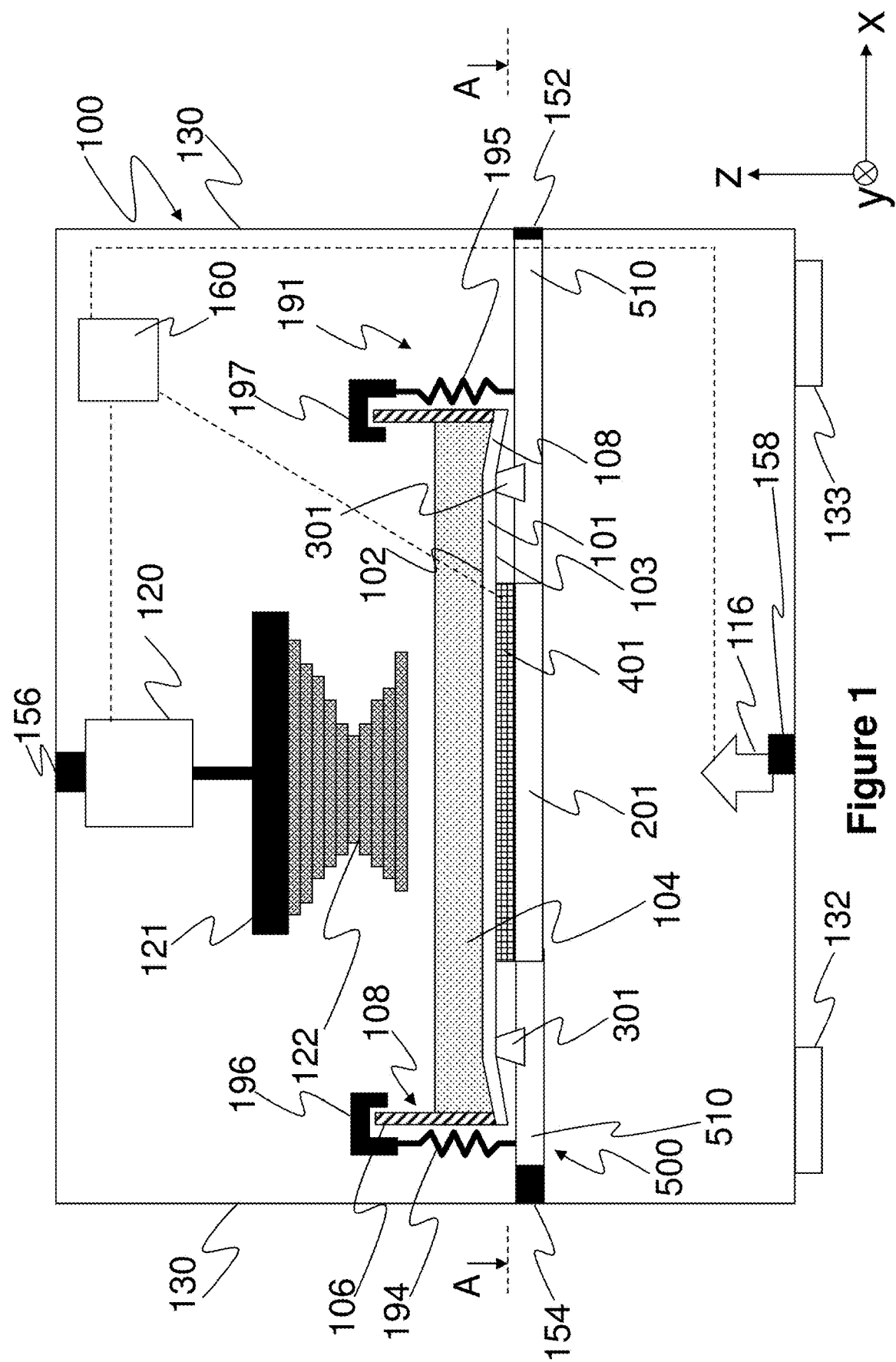
FIGS. 1 to 4 show schematic elevation views of one embodiment of an apparatus for making a stereolithographic object during the various stages of its use.

FIGS. 1 to 4 show schematic views of one embodiment of an apparatus at which an object in the form of a stereolithographic object can be made, the apparatus being generally indicated by the numeral 100. The figures taken in sequence indicate one embodiment of a method for making an object. Coordinate axes are shown in the figures where x and y are horizontally orientated and z is vertically orientated.

The apparatus 100 has an element that is flexible and is in the form of a substantially transparent sheet 101 over which a layer of material in the form of photohardenable liquid 104 is disposed. The element may be inflexible in another embodiment. A photohardenable liquid (or photocurable liquid) is a liquid that hardens when exposed to a radiation such as visible or invisible light (ultraviolet light, for example). Example wavelengths of suitable light include 355 nm, 385 nm, and 405 nm. In some embodiments, radiation sources other than light may be used. For example, the radiation source may be ionizing or non-ionizing radiation.

The photohardenable liquid may comprise a mixture of acrylate monomers and oligomers, photoinitiators, colourants and stabilizers such that the mixture polymerizes when exposed to suitable light. Example liquids include Somos NEXT from DSM Somos, USA, and KZ-1860-CL from Allied PhotoPolymers, USA.

Element 101 may possess anti-stick properties in relation to the photohardenable material 104 when it is cured in contact with the sheet. Suitable materials for element 101 include FEP fluoropolymer film manufactured by Du Pont, USA. The film may be of around 125 micrometers thickness, but may be thicker or thinner as appropriate. The sheets are flexible but may not be particularly elastic, having a Young's modulus of around 560 MPa. Generally, but not necessarily, a Young's modulus of between 100 and 1000 MPa may be suitable. Other examples of suitable materials include PFA fluoropolymer film and Teflon AF film, also manufactured by Du Pont. Still other examples of suitable materials are silicone, polyethylene film and cellulose acetate film. Generally, any suitable material may be used for the element.

In this embodiment, the sheet 101 is not backed by another material or layer, and is homogeneous, that is has a uniform structure and composition throughout. In other embodiments the sheet may have a multilaminate construction. For example, the sheet may comprise a layer of silicone bonded to a polyester film, the film providing a high Young's modulus and the silicone providing a superior nonstick surface in relation to the photohardenable material 104. Other materials or laminates of different materials may alternatively be used.

The sheet 101 and side walls 106 form a shallow vessel in the form of a trough or dish 108 for containing the photohardenable liquid 104. The vessel may have a volume sufficient to hold enough liquid to build an entire object without being replenished. Optionally, a conduit may connect the vessel and a supply of the liquid to replenish the liquid as it is consumed. The sheet 101 forms the base of the trough 108. The trough 108 and the liquid 104 contained therein can be removed from the apparatus and replaced with another trough and liquid, thus providing a convenient means for replacing damaged troughs or making objects from different materials.

The apparatus has member 301 that supports the element. In this embodiment, member 301 supports the element around a perimeter of a transparent plate 201 having an uppermost reference surface 202. The underside of the sheet 101 is biased towards member 301 with spring elements 194,195 which causes the sheet 101 to be tensioned in both the x and y directions.

A tactile sensor in the form of a pressure sensitive array 401 supports the element 101. In this embodiment, the tensile sensor is positioned below and in contact with the sheet 101, however, there may be an intermediary component. The tactile sensor 401 is configured to generate position information indicative of an applied force. The position information may be indicative of a position in at least one of two orthogonal axis, for example x and y. In this embodiment, the position-sensitive detector 401 is a transparent resistive touch-screen panel sensor such as those used in touch-sensitive computer screens. Examples of such sensors are model 5W-070W 5-wire resistive touch panels manufactured by OneTouch, Taiwan. The touch panel may comprise a transparent array of indium-tin-oxide conductors spaced apart from another conductive indium-tin-oxide sheet by spacing elements. Pressure applied to the panel causing the conductors to touch generates a signal of coordinates of the location of the pressure. The indium-tin-oxide conductors are transparent to light 118 generated in the apparatus. The tactile sensor may alternatively be piezoresistive, piezoelectric, capacitive, elasto-resistive, or generally be any suitable form of tactile sensor.

The embodiments of FIGS. 1 to 4 are each configured such that in use the sheet 101 is horizontally orientated. The apparatus may, for example, have a chassis 130 with attached feet 132,133 configured to support the chassis above a surface such as a bench, and the sheet is mounted relative to the chassis so that when the chassis is so supported the sheet has a horizontal orientation. In other embodiments, the surface of the sheet which the liquid is disposed on may be inclined at up to 45 degrees to the horizontal (that is, the surface is upwardly facing), provided that the vessel walls are sufficiently high to contain the fluid. Mounting brackets 152,154,156,158 may be used to ensure that apparatus components are maintained in their correct position and orientation relative to the chassis. A mounting platform 510 may serve to mount apparatus components, and is mounted to form a fluid barrier between the upper and lower regions of the apparatus to prevent ingress of any spilled photohardenabe fluid 104 which could damage delicate components.

Figure 8:
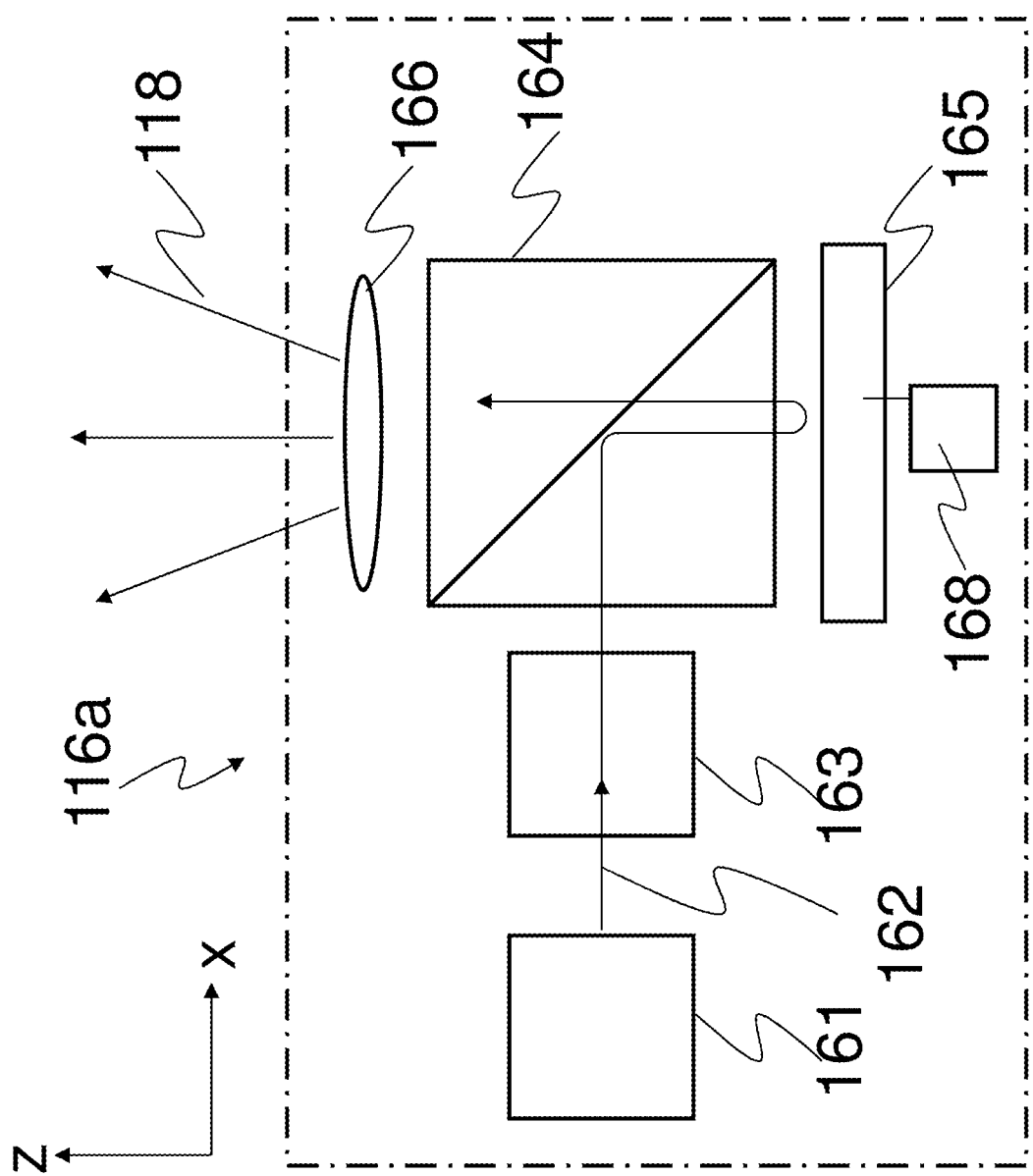
FIGS. 8 to 10 show schematic views of example radiation sources that may be part of the apparatus of FIG. 1.
Figure 9:
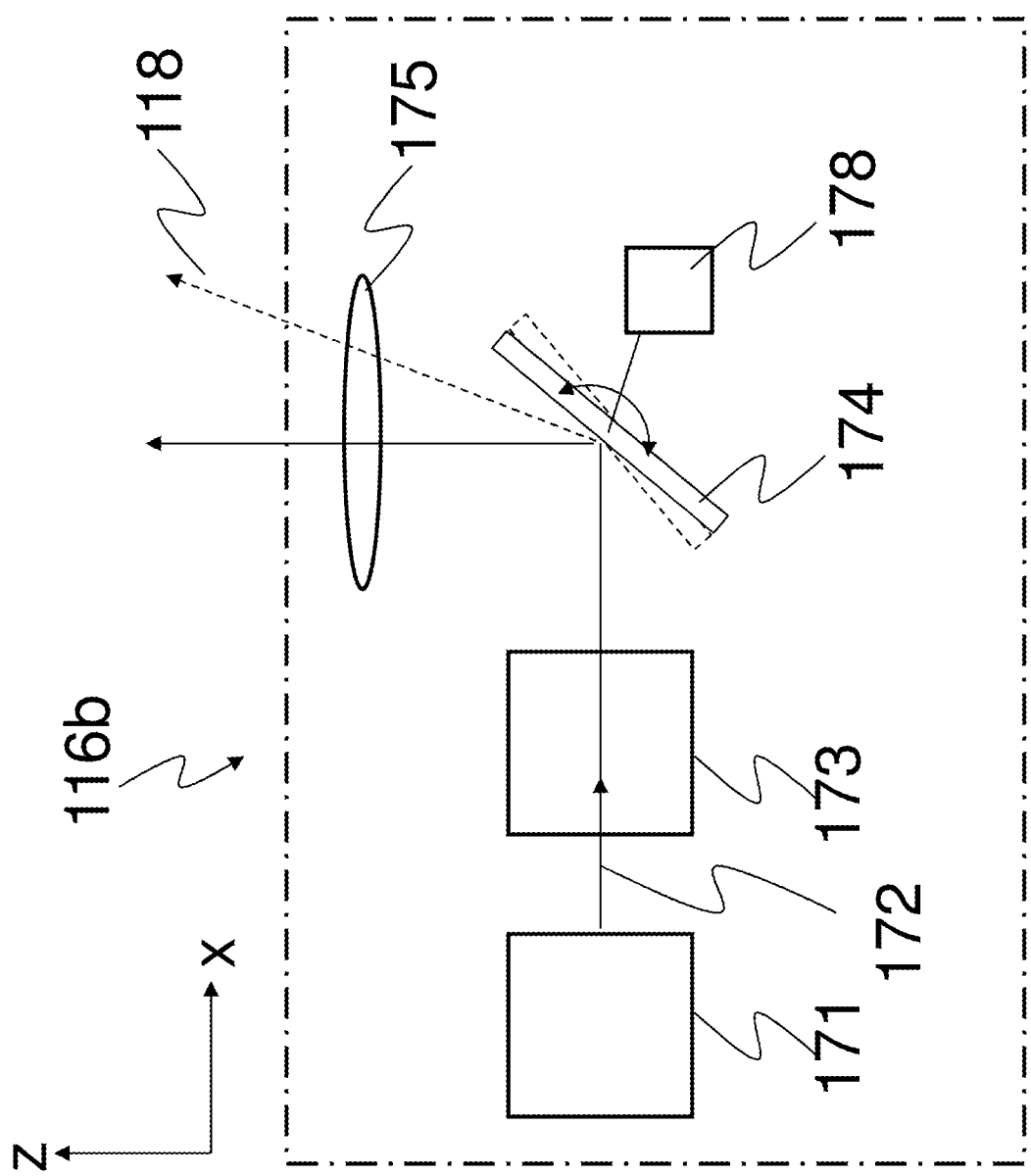
Figure 10:
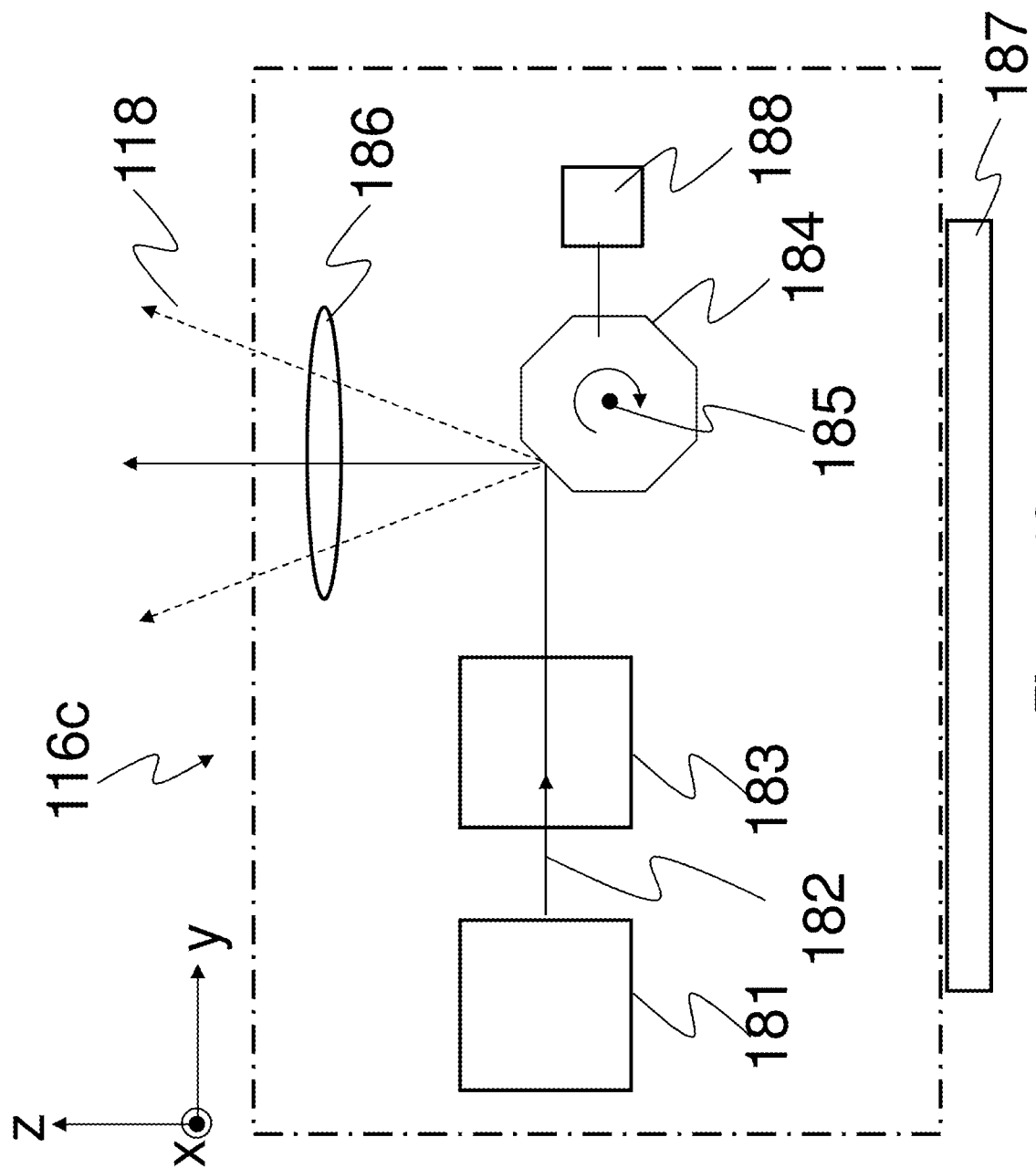

A radiation source in the form of a light source 116 may be activated so that it emits spatially and/or structured light 118 capable of selectively hardening areas of the photohardenable liquid 104 to form a section of the object. Light source 116 may, for example, incorporate a light manipulator such as an image projection system depicted in FIG. 8 and generally indicated with the numeral 116a, comprising light source 116 emitting light 162, relay optics 163, turning prism 164, spatial light modulator 165 controllable by controller 168, and projection lens 166. Alternatively, light source 116 may be a light beam scanning apparatus depicted in FIG. 9 and generally indicated by the numeral 116b, comprising a laser source 171 emitting light 172 of wavelength of around 350 nm, for example, collimating and/or focusing optics 173, scanning mirror 174 whose rotation is controllable in one or more axes by mirror controller 178, optionally a second controllable mirror not shown in the figure, and optionally a projection lens 175 such as an F-Theta lens. Controller 178 can be configured to scan the mirror 174 (coordinated with a second mirror, if present) in a raster scanning mode, or alternatively in a vector scanning mode. FIG. 10 shows a second type of beam scanning apparatus generally indicated by the numeral 116c comprising a laser source 181 emitting light 182, collimating and/or focusing optics 183, polygon mirror 184 rotatable around an axis 185 and controllable by controller 188, and optionally a projection lens 186 such as an F-Theta lens. As the apparatus of 116c may only scan light in the y-axis according to the coordinate system shown in FIG. 10, the apparatus resides on a translation stage 187 which can move the apparatus in the x-direction, enabling the projected light to address locations in the x and y dimensions. The translation stage may comprise any one or more of linear motors, drive belts, stepper motors, rack and pinion arrangements, for example, or generally any suitable components arranged to provide translation. Apparatus 116c is suitable for operating in a raster scanning mode. The light source may, in some embodiments, comprise an incandescent light or light emitting diode, for example. Any suitable light source may be used.

Referring again to FIGS. 1 to 4, a positioner 120 capable of linear motion along the z-direction is coupled to and moves a platform 121 in the form of an inverted platform on which the object being made is mounted. The positioner 120 positions the object being made 122 relative to the upwardly facing surface 102 of the sheet 101. The positioner may comprise any one or more of linear motors, drive belts, stepper motors, rack and pinion arrangements, for example, or generally any suitable components arranged to provide linear motion. Alternatively or additionally, the positioner may be operationally coupled to the element for changing the distance between the surface 102 and the platform 121.

A sequence of actions can be performed with the apparatus 100 to form a new section of the object 124 and non-destructively separate it from the sheet 101. The process begins as shown in FIG. 1, with the previous sections of the object under fabrication 122 distanced from the sheet 101.

Figure 2:
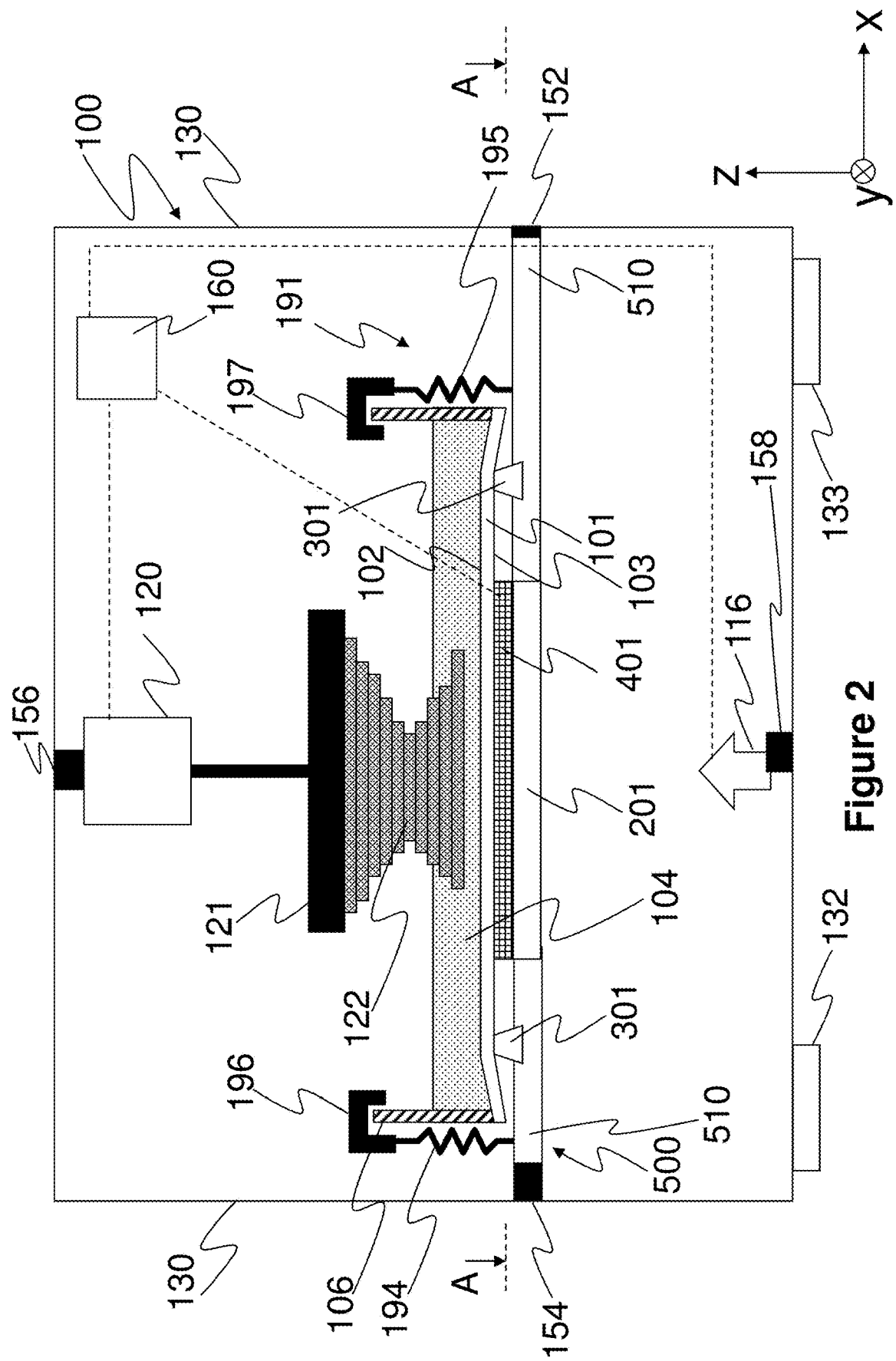

Next, as shown in FIG. 2, positioner 120 lowers the object being made 122 towards the sheet 101. The object 122 comes to a final position which is one section-thickness above the sheet surface 102.

Tactile sensor 401 additionally shapes the sheet 101 to have it adopt a flat configuration or form while excess photohardenable liquid 104 is forced out of the gap between the previously hardened sections 122 and the sheet 101. The tactile sensor 401 senses contact made between the previously hardened sections 122 and the sheet 101 which may be caused by unexpected solid debris between them, and corrective action may be taken as will be discussed later. Support of the sheet 101 by the position-sensitive detector 401 may allow for especially flat sections of precise thicknesses to be formed.

The thickness of one section is typically in the range of 10 micrometers to 250 micrometers, but it may be less if particularly fine fabrication resolution is required, and greater if a relatively coarse fabrication resolution is required.

Figure 3:
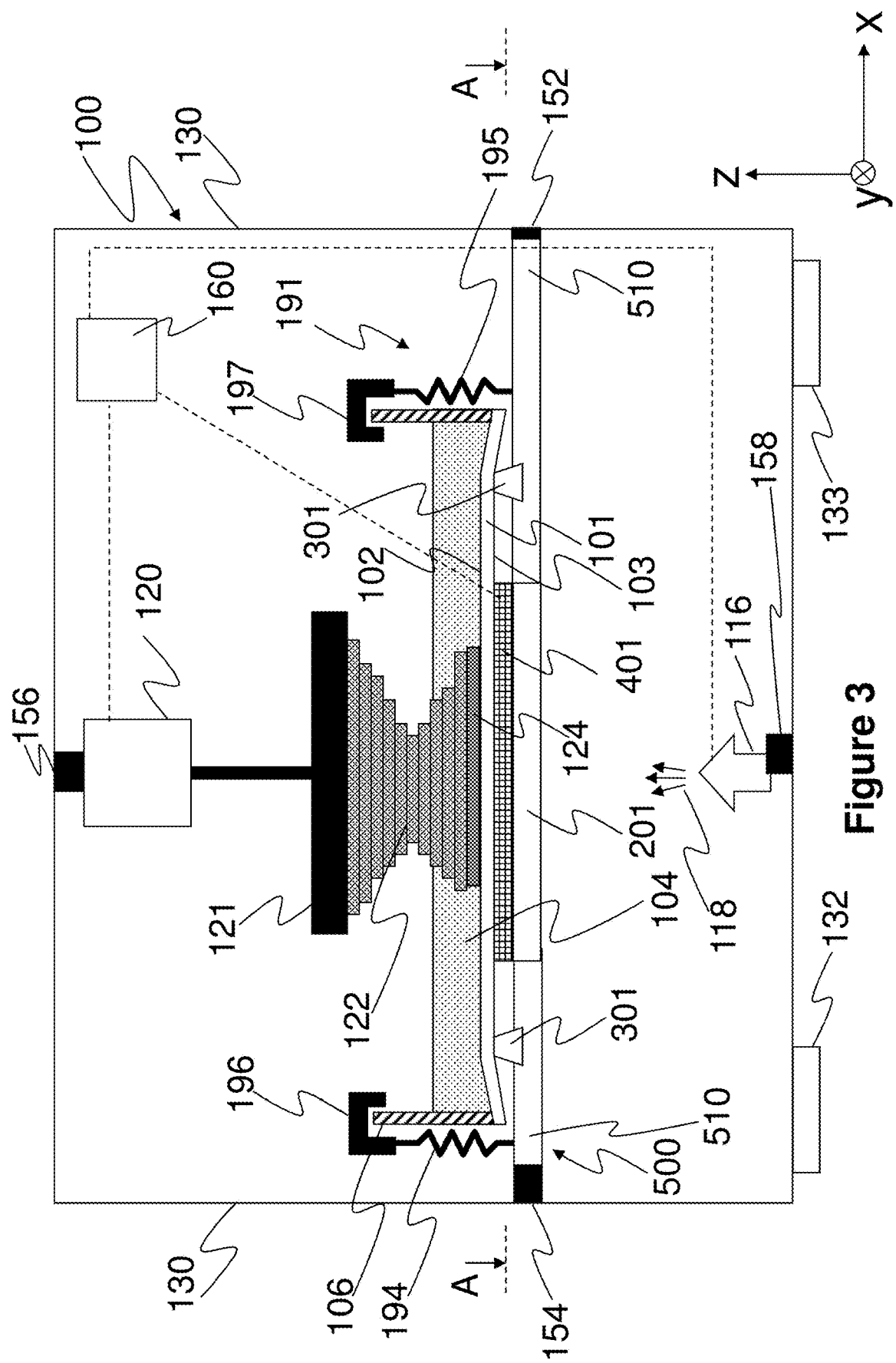

Next, as shown in FIG. 3, light 118 having spatial features in accordance with the sectional geometry of the object being made is emitted from light source 116 to selectively harden regions of the layer of photohardenable liquid 104 in contact with the previously formed sections 122 to form a new hardened section 124. The tactile sensor 401 is transparent to the light 118.

Figure 4:
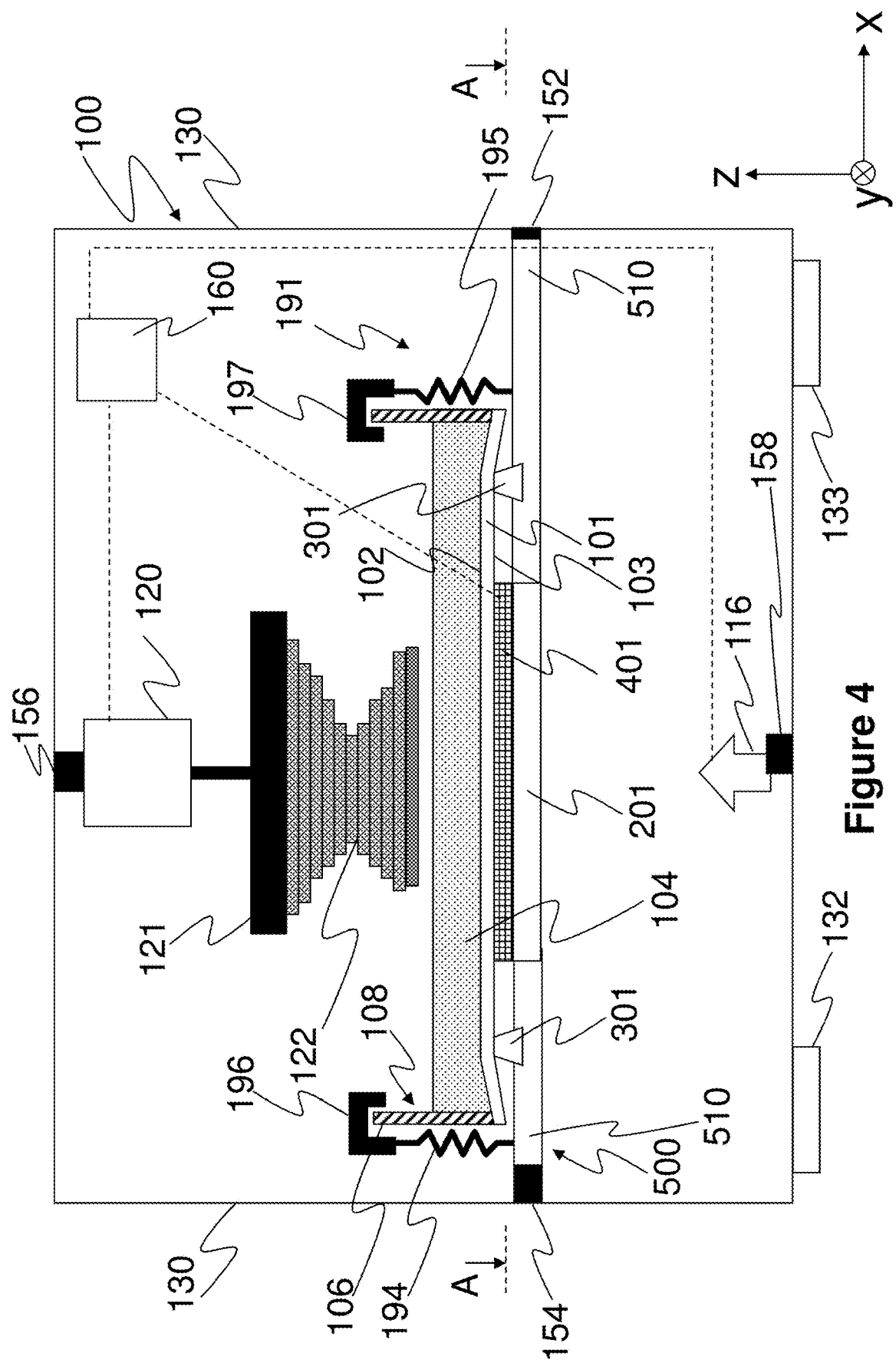

Next, as shown in FIG. 4, mechanical actuator 120 is engaged to raise the previously formed sections 122 and newly formed section 124, causing it to be pulled away from the sheet 101. The apparatus 100 is then ready for the process to start again. Repeating this sequence of actions enables a multilaminate object to be fabricated section by section.

The tactile sensor 401 in this embodiment of an apparatus supports the sheet 101, so that the sheet 101 adopts a flat configuration. A flat section of consistent thickness may subsequently be formed.

In other embodiments, the reference surface 202 may be configured such that the sheet is caused to adopt a configuration other than a flat configuration. This changes the distribution of the liquid material accordingly so that the spatial configuration of the liquid material between the sheet and the object is changed or modified to the desired shape. For example, a curved sheet configuration may be advantageous if the object being made has a rounded shape or if the light source 116 projects light 118 to a curved focal plane.

Alternatively, the sheet may be shaped or configured so that its upper surface has a desired configuration while maintaining a flat lower surface configuration. Thus, as the section of the object is formed, the lower surface of the object section takes on the same configuration as the upper surface of the sheet. It will be understood that the configuration of the upper surface of the sheet may be any suitable desired geometrical arrangement.

Figure 5:
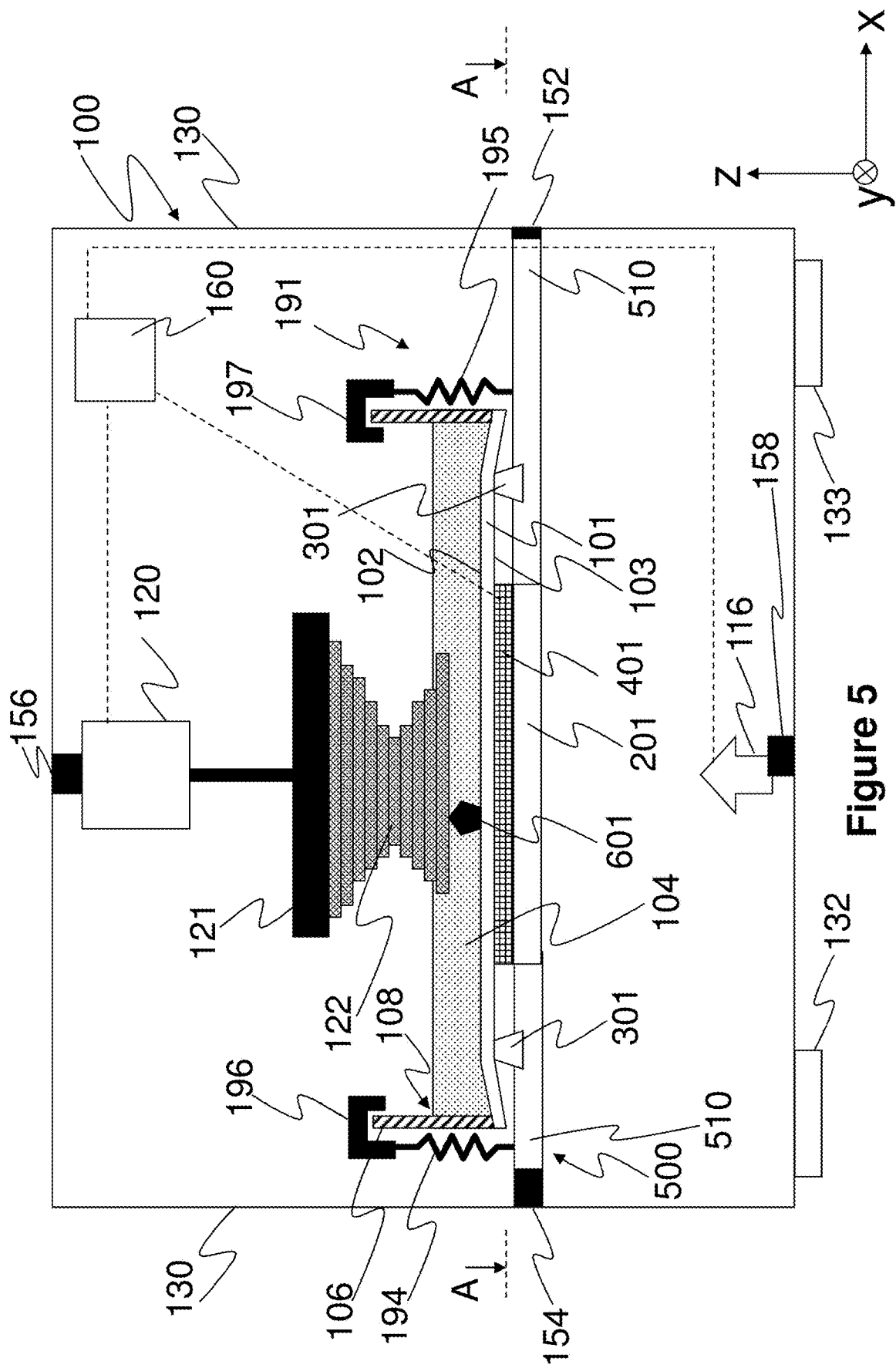
FIG. 5 shows an embodiment of the apparatus of FIG. 1 where a piece of solid debris is present in the fabrication fluid.
Figure 6:
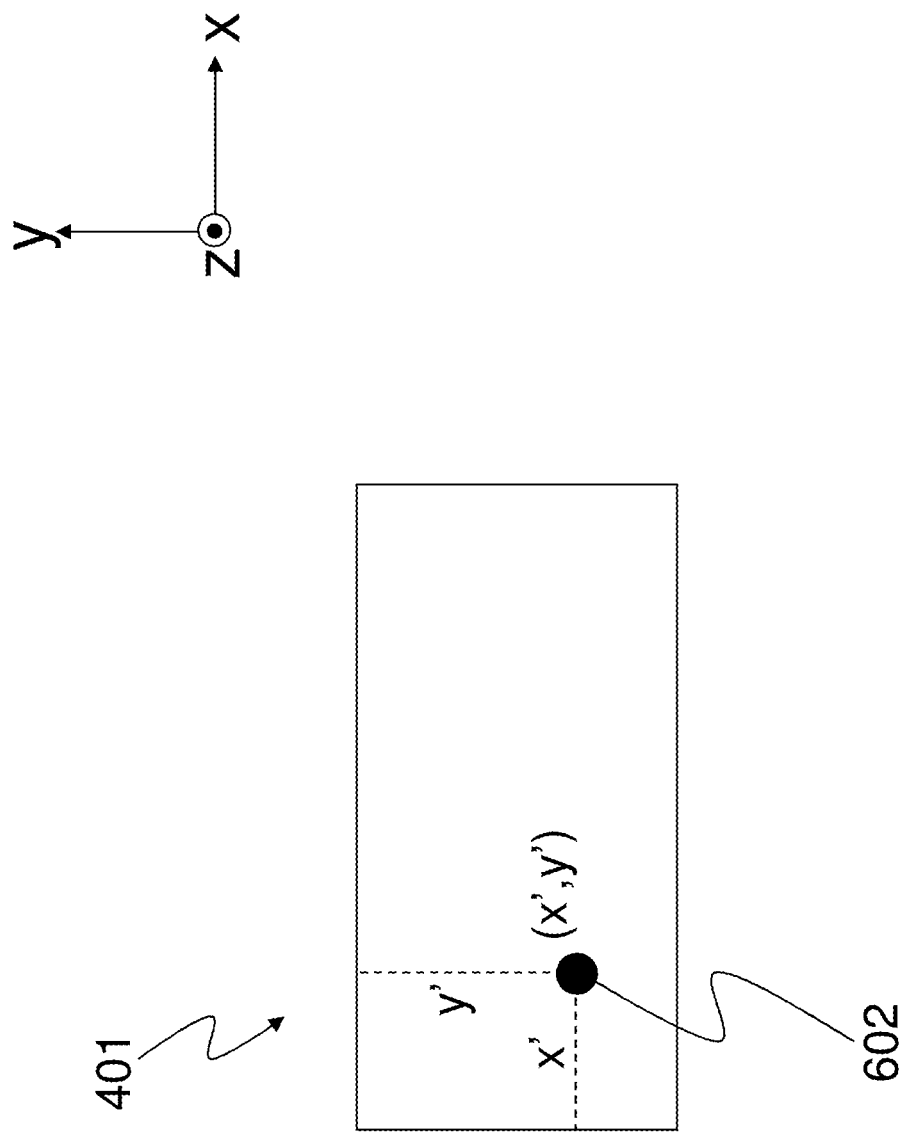
FIG. 6 shows a plan view of an example of a tactile sensor used in the apparatus of FIG. 1.
Figure 7:
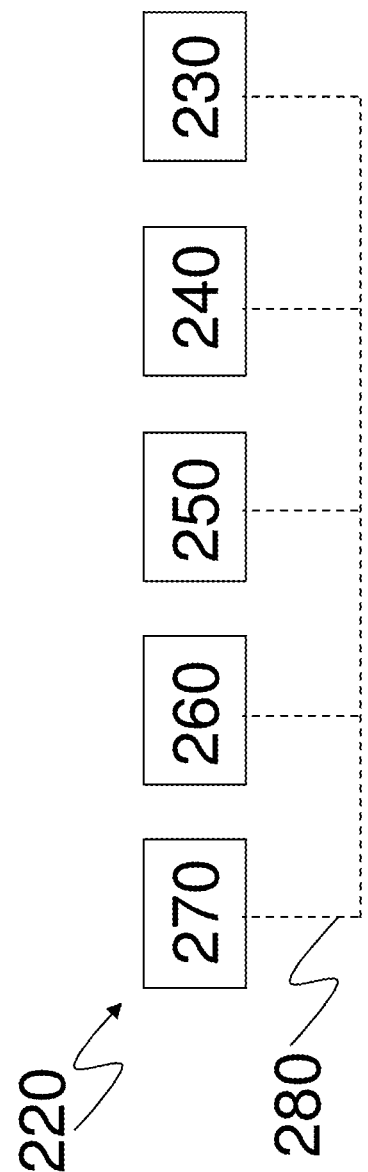
FIG. 7 shows an example architecture of a controller for controlling the apparatus of FIG. 1.

FIG. 5 shows the apparatus 100 having a piece of solid debris 601 disposed between the object being made 122 and the element 101. The debris 601 may be hardened material 401 resulting from a partially formed object detaching from the platform 121, material which has been hardened due to stray radiation in the system (both common and problematic occurrence in stereolithographic processes) or foreign matter, for example. Moving the object being made 122 towards the element 101 may cause the object being made 122 to collide with the debris 601 which results in forces applied to the object being made 122 and the sheet 101. This may result in damage to the object 122 and/or the sheet 101. The tactile sensor 401 generates force and/or contact position information comprising an x and y coordinates (x',y') as shown in FIG. 6. A signal comprising the information is sent to controller 160 and further motion of the positioner 120 is halted by the controller. The controller may generate an alert in the form of a light, sound or electronic message for example, notifying the user of a fault.

Such fault notification can prevent damage to the apparatus and save the user from wasting valuable fabrication time and materials.

Referring back to FIG. 1, the tactile sensor 401 is mounted on a window 201 fabricated of a material transparent to the curing radiation 118 emitted by light source 116. For example, when the curing radiation is 385 nm wavelength light, the window 201 may comprise a 6 mm thick plate of fused silica. The edges of the reference plate 201 may be beveled, or even rounded, to reduce the risk of a scratch or other mark being made on the underside surface 103 of the sheet.

The positioner 120, the light source 116, the position-sensitive detector 401 and possibly other parts of the apparatus may be in communication with and may be controlled by a controller 160 to coordinate the apparatus to make the object. These and other components may be connected by wires, cables, wireless, or any other suitable means. In this embodiment, the controller may have a processor unit 220, schematically illustrated in FIG. 10. The processor unit 220 may include a suitable logic device 250 such as, or similar to, the INTEL PENTIUM or a suitably configured field programmable gate array (FPGA), connected over a bus 280 to a random access memory 240 of around 100 Mb and a non-volatile memory such as a hard disk drive 260 or solid state non-volatile memory having a capacity of around 1 Gb. The processor has input/output interfaces 270 such as a universal serial bus and a possible human machine interface 230 e.g. mouse, keyboard, display etc. Apparatus components may be controlled using commercially available machine-to-machine interfaces such as LABVIEW software together with associated hardware recommended by the commercial interface provider installed on the processor unit 220, over USB or RS-232 or TCP/IP links, for example. Alternatively, custom driver software may be written for improved performance together with custom printed circuit boards. Alternatively, the processor unit 220 may comprise an embedded system.

In this embodiment, the controller 160 is in communication with another processor which is adapted for determining instructions and/or information for the apparatus. In alternative embodiments, the processors are the same processor. An example of another processing unit comprises a logic device such as, or similar to, the INTEL PENTIUM or a suitably configured field programmable gate array (FPGA), connected over a bus to a random access memory of around 100 Mb and a non-volatile memory of such as a hard disk drive or solid state non-volatile memory having a capacity of around 1 Gb. The processor has a receiver such as a USB port (or Internet connection, for example) for receiving information representing a solid object, stored on a USB FLASH device, for example. The information may be encoded in a file generated by a Computer Aided Design (CAD) program, the information specifying the geometry of the object. The microprocessor runs a decomposer program implementing an algorithm that decomposes (or transforms) the information into data indicative of a plurality of sections to be formed sequentially by the apparatus, the material being used to make the solid object. The program may have been installed onto the processor from tangible media such as a DVD or USB memory stick, for example, that stored the program. In an alternative embodiment, the decomposer may be a dedicated hardware unit. A series of sections through the object are determined, each section corresponding to a solid section to be formed. The sections may then be further processed to represent the geometry of each section as a rasterised bitmap. The sections or bitmaps may then be used to control the apparatus.

Figure 11:
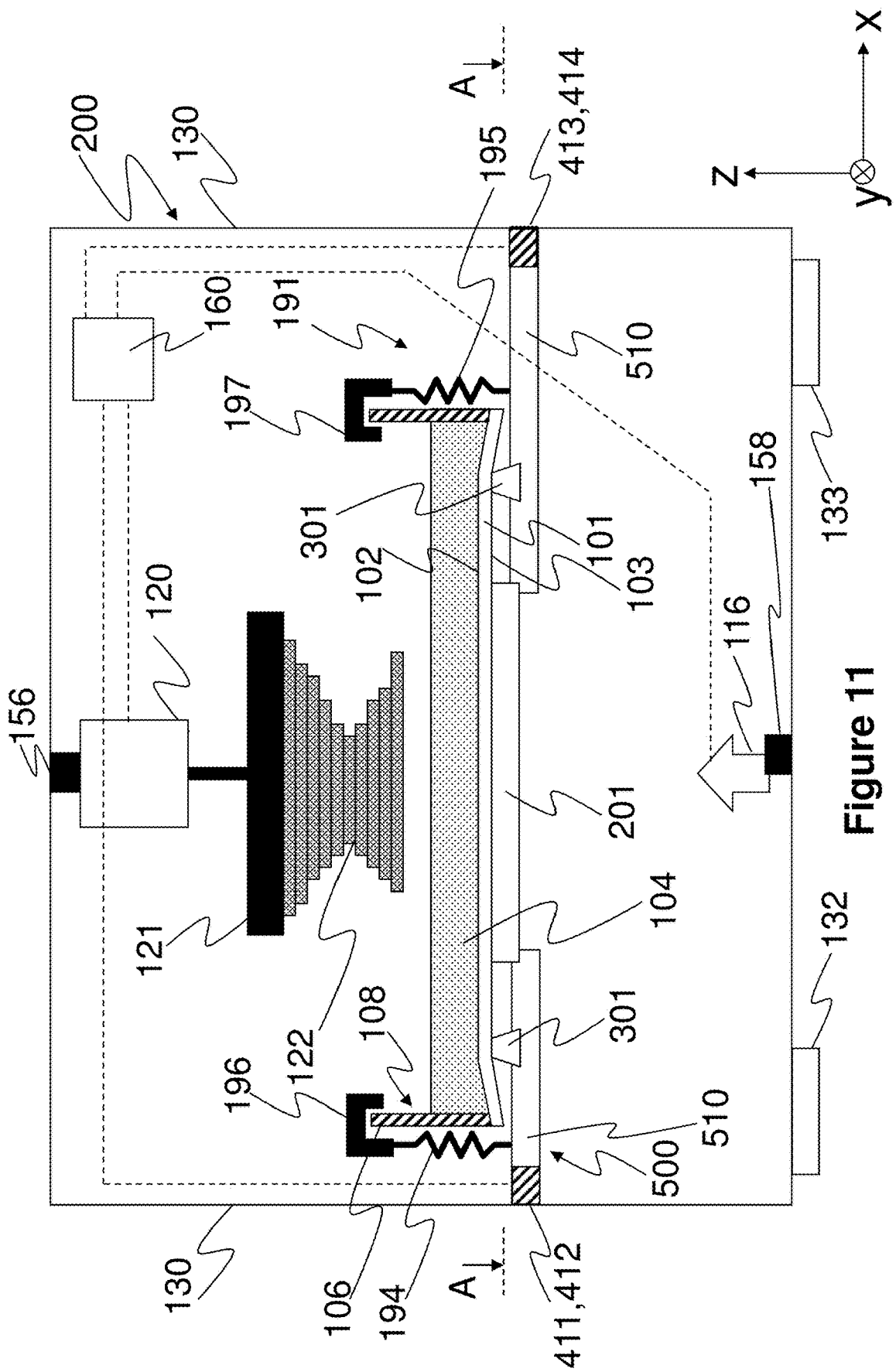
FIG. 11 shows a schematic elevation view of another embodiment of an apparatus for making a stereolithographic object.

FIG. 11 shows a schematic view of a second embodiment of an apparatus at which an object in the form of a stereolithographic object can be made, the apparatus being generally indicated by the numeral 200. Coordinate axes are shown in the figures where x and y are horizontally orientated and z is vertically orientated. Parts having similar form and/or function to those in FIGS. 1 to 4 are similarly numbered.

Figure 12:
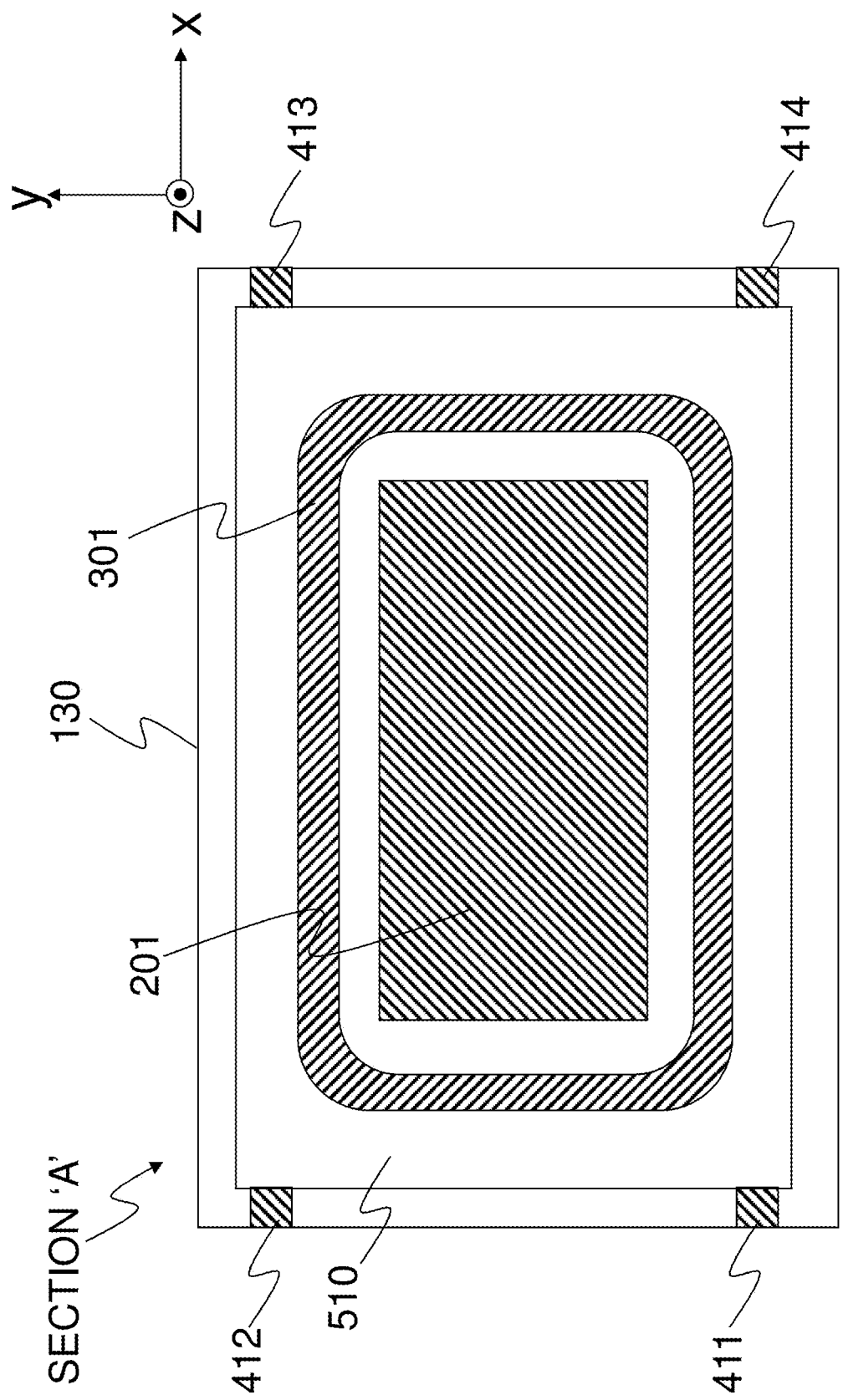
FIGS. 12 and 13 show schematic section views of sections of embodiments of an apparatus for making a stereolithographic object.

The apparatus of FIG. 11 employs a plurality of force sensors, in this embodiment a plurality of force transducers in the form of four load cells 411,412,413,414. Load cells 411,412 are aligned in the x direction and spaced apart in the y direction, so appear superimposed in FIG. 11. The same applies to load cells 413,414. That is, in this embodiment the load cells are located at respective vertices of a rectangle in the x,y plane, as shown in FIG. 12 which is section A-A from FIG. 11. Load cells 411,412,413,414 are mounted to the chassis 130. The mounting platform 510 and the element 101 are supported by the load cells, in this but not necessarily all embodiments solely by the load cells. Thus, any force applied to the components mounted to the mounting platform 510 is transmitted to the load cells. The load-cells 411,412,413,414 generate a signal in the form of a linear signal indicative of the force applied thereto. The magnitude of the force exerted on each load cell is a function of the distance the contact point is from the load cell. The sum of the reactive forces in the load cells is equivalent to the total weight of the mounting platform 510 and any components attached to it, plus any forces applied to them, where 'plus' in this context means vector addition. Load cells 411,412, 413,414 are in signal communication with controller 160.

Taken together, load cells 411,412,413,414 operate as a position-sensitive detector which can measure the position and magnitude of any force applied to the mounting platform in two dimensions. For example, the plurality of load cells 411,412, 413, 414 permits positional information indicative of the location of solid debris between the object being made 122 and the surface 102. The force information is indicative of a portion of the force sensed by each of the plurality of force sensing elements 411, 412, 413, 414. If the forces applied to the four load cells are F1, F2, F3, F4, and the load cells are located at corresponding positions coordinates L1, L3, L3, L4—which are expressed as vectors (x,y)—where the origin is at the geometric centre of mass of the force sensing elements' locations, and the sum of the forces sensed by the plurality of force sensing elements 411,412,413,414 is F, the location of the debris detected is estimated as the weighted position using the following example of a force centre function:

$$(x_c, y_c) = L1*F1/F + L2*F2/F + L3*F3/F + L4*F4/F$$

The control system 160 is configured to calculate $(x_c, y_c)$ using the above force centre function and the force information to determine a position on the surface 102 that the force is applied to.

The controller 160 of apparatus 200 can be configured to detect higher than expected forces during fabrication. These forces may be a result of solid debris in the material vessel 108 being compressed between the object 122 and the sheet 101. In such circumstances, the fabrication may be halted to prevent damage to the apparatus. A user may be notified of the debris and provided with a position of the debris on the sheet 101. This may be of particular utility when the photohardenable material 104 contains pigments making it opaque to the user, allowing them to quickly identify and remove the debris then continue the fabrication process.

An additional benefit of apparatus 200 is that during operation it can measure the decline in weight of the material 104 in the vessel 108 during the fabrication process. Controller 160 can be configured to pause the fabrication process when it is determined that the material 104 in the vessel 108 needs to be replenished. After replenishment, the fabrication process may be continued. This may reduce the likelihood of failed builds due to insufficient material.

Figure 13:
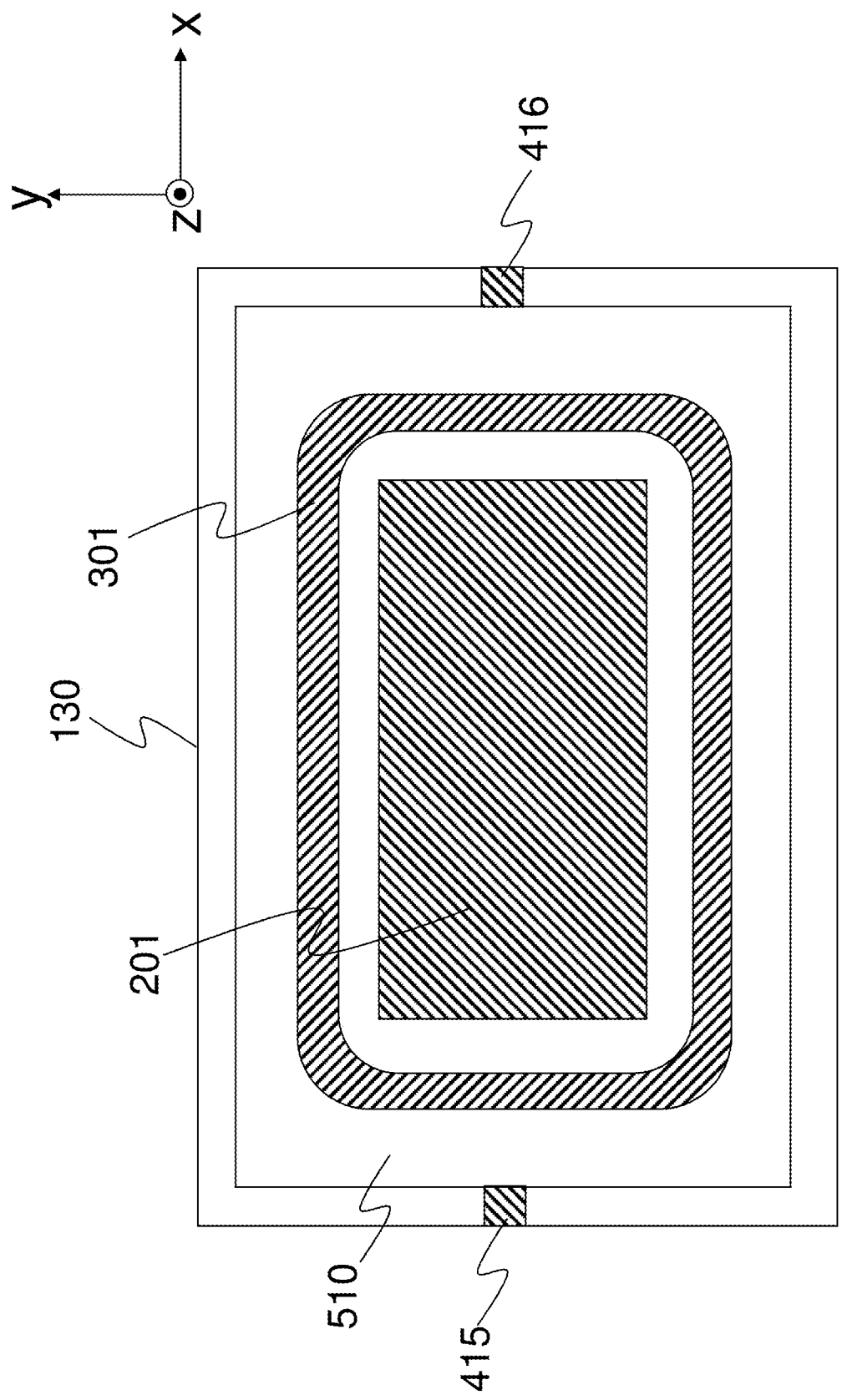

The use of four load cells 411,412,413,414 may provide redundant information. Position sensing in two dimensions may be achieved with three load cells whilst position sensing in one dimension can be achieved with two load cells 415,416 as shown in the embodiment in FIG. 13 where components having similar and/or identical form and/or function to those of the embodiment of FIG. 11 are labeled similarly. Redundant information may, however, allow more precise measurement through noise filtering and continued operation should one of the load cells fail.

Apparatus 200 can equivalently be deployed with a more rigid vessel bottom. For example, the vessel 108 may incorporate the window 201. The vessel 108 may comprise a perimeter wall and a glass base, the interior of which are side coated with silicone or layer of fluoropolymer material such as those fluoropolymer materials mentioned above to provide an anti-stick coating.

Embodiments described herein may be used to make a stereolithographic object of generally any shape or size, including jewelry such as rings, prototype car components, micro-components for precision machines, models for investment casting, rapid prototypes, dental models, hearing aids, models of anatomical and other objects, circuit boards and architectural or design features for a building. The stereolithographic object may, for example, be rigid or resilient. It may have one or more hollows or voids, such as that of a cup or tennis ball, for example.

Now that embodiments of the invention have been described, it will be appreciated that some embodiments may have some of the following advantages:
 solid debris may be detected and the apparatus paused to prevent collisions which could damage the apparatus, and the user may be supplied with the position of the debris.
 having the fluid disposed over the surface requires a relatively modest volume of fluid, reducing costly waste.
 the weight of photohardenable material in the material holding vessel may be monitored during the fabrication process and the process may be paused if the material requires replenishment, thereby reducing the chance of failed builds.

It will be appreciated that numerous variations and/or modifications may be made to the invention as shown in the specific embodiments without departing from the spirit or scope of the invention as broadly described. The tactile sensor may be a capacitive touch-screen sensor and a voltage generator may be connected between the build platform 121 and the window 201 to generate a capacitance response. Any suitable position sensitive detector may be used. The flexible element may not be flat like a sheet, but rather may be wedged. The downwardly facing surface of the element may be textured. The upward facing surface of the reference plate may be textured. The present embodiments are, therefore, to be considered in all respects as illustrative and not restrictive.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

It is to be understood that, if any prior art publication is referred to herein, such reference does not constitute an admission that the publication forms a part of the common general knowledge in the art, in Australia or any other country.

The invention claimed is:

1. An apparatus for making a stereolithographic object, the apparatus comprising:
 an element having a surface for disposing thereon a material used to make a stereolithographic object;
 a platform for making the stereolithographic object thereon;
 a positioner operably coupled to at least one of the platform and the element and operable to change a distance between the platform and the element and so change a distance between a portion of the stereolithographic object when made and the surface to be the thickness of a stereolithographic layer of the stereolithographic object; and
 a force sensing system configured to generate force information indicative of a force transferred between the element and the platform; and
 a controller for processing the force sensing information, the controller being configured to generate force position information indicative of the position of the force on the element using the force information;
 wherein the force is transferred between the element and the platform by debris disposed therebetween, and the position information is indicative of the position of the debris on the element.

2. An apparatus defined by claim 1 wherein the force sensing system supports the element.

3. An apparatus defined by claim 2 wherein the force sensing system has a flat surface on which the element is received, causing the element to adopt a flat configuration.

4. An apparatus defined by claim 1 wherein the force sensing system comprises a pressure sensitive array of tactile sensors.

5. An apparatus defined by claim 4 wherein the pressure sensitive array of tactile sensors is transparent to a material hardening light.

6. An apparatus defined by claim 4 comprising a radiation source configured to generate the material hardening light and direct the material hardening light to the surface through the pressure sensitive array of tactile sensors and the element for selectively hardening an area of the material when so disposed.

7. An apparatus defined by claim 4 wherein the pressure sensitive array of tactile sensors comprises a touch-screen sensor.

8. An apparatus defined by claim 1 wherein the force sensing system comprises a plurality of force sensors that are spaced apart.

9. An apparatus defined by claim 8 wherein the force sensing system comprises a plurality of force sensors that are spaced apart in at least one direction that is orthogonal to a normal to the surface.

10. An apparatus defined by claim 9 wherein the force sensing system comprises a plurality of force sensors that are spaced apart in two directions that are each orthogonal to a normal to the surface.

11. An apparatus defined by claim 9 wherein the force information is indicative of a portion of the force sensed by each of the plurality of force sensors.

12. An apparatus defined by claim 1 wherein the controller is configured to generate a debris detection alert.

13. An apparatus defined by claim 1 wherein the controller is configured to stop the positioner reducing the distance between the platform and the element when debris is detected.

14. An apparatus defined by claim 1 wherein the processor is configured to use the force information to determine a quantity of material.

15. An apparatus defined by claim 1 wherein the control system is configured to use the force information to determine a position on the material receiving surface that the force is applied to.

* * * * *